US006853662B2

(12) United States Patent
Rogers

(10) Patent No.: US 6,853,662 B2
(45) Date of Patent: Feb. 8, 2005

(54) ELECTRICALLY PUMPED, POLYCRYSTALLINE ZNO LASER AND A METHOD OF FABRICATING THE SAME

(76) Inventor: David J. Rogers, 25 rue Alphonse Pécard, F-91190 Gif-sur-Yvette (FR)

( * ) Notice: Subject to any disclaimer, the term of this patent is extended or adjusted under 35 U.S.C. 154(b) by 0 days.

(21) Appl. No.: 10/441,405

(22) Filed: May 20, 2003

(65) Prior Publication Data
US 2003/0227951 A1 Dec. 11, 2003

Related U.S. Application Data

(63) Continuation of application No. PCT/FR01/03711, filed on Nov. 23, 2001.

(30) Foreign Application Priority Data

Nov. 23, 2000 (FR) .............................. 00 15107

(51) Int. Cl.[7] ................................. H01S 5/00
(52) U.S. Cl. ............................ 372/43; 372/39; 372/41; 372/44; 372/45; 372/46
(58) Field of Search ............................. 372/39, 41, 43, 372/44, 45, 46

(56) References Cited

U.S. PATENT DOCUMENTS

| 4,081,764 A | | 3/1978 | Christmann et al. |
| 6,291,257 B1 | * | 9/2001 | Kadota ........................ 438/46 |
| 6,525,345 B1 | * | 2/2003 | Kadota ........................ 257/94 |

FOREIGN PATENT DOCUMENTS

| EP | 0 863 555 A2 | * | 9/1998 | ........... H01L/33/00 |
| WO | WO 00/16411 | | 3/2000 | |

OTHER PUBLICATIONS

Kawasaki M. et al.: "Excitonic ultraviolet laser emission at room temperature from naturally made cavity in ZnO nanocrystal thin films", *Materials Science and Engineering B*, vol. 56, No. 2–3, Nov. 6, 1998, pp. 239–245.

* cited by examiner

*Primary Examiner*—Don Wong
*Assistant Examiner*—Leith Al-Nazer
(74) *Attorney, Agent, or Firm*—Piper Rudnick LLP

(57) ABSTRACT

The invention includes an electrically pumped polycrystalline ZnO laser and it's fabrication procedure. A film of ZnO is grown on a suitably adapted polycrystalline underlayer in which the grains are surrounded by electrically insulating boundaries.

13 Claims, 2 Drawing Sheets

ELECTRICALLY PUMPED, POLYCRYSTALLINE ZNO LASER AND A METHOD OF FABRICATING THE SAME

RELATED APPLICATION

This is a continuation of International Application No. PCT/FR01/03711, with an international filing date of Nov. 23, 2001, which is based on French Patent Application No. 00/15107, filed Nov. 23, 2000.

FIELD OF THE INVENTION

This invention relates to an electrically pumped, polycrystalline ZnO laser and a method of making the laser.

BACKGROUND

Semiconductor lasers based on polycrystalline thin films of ZnO and techniques for pumping them optically are known. The article of H. Cao et al. entitled "Ultraviolet lasing in resonators formed by scattering in semiconductor polycrystalline film" and published in "Applied Physics Letters", Vol. 73, No. 25, 21, Dec. 1998, pp. 3656–3658, describes such a laser in which resonant cavities are self-formed because of high optical diffusion in the active material. This medium is obtained by growing a polycrystalline thin film of Zinc Oxide on amorphous melted silicon. The active material is optically pumped with a laser beam of 355 nm obtained by using a frequency tripling a locked mode YAG-Nd laser. The laser emission is ultraviolet, at about 380 nm.

The article by Z. K. Tang et al. entitled "Room-temperature ultraviolet laser emission from self-assembled ZnO microcrystalline thin film" and published in the journal "Applied Physics Letters", Vol. 72, No. 25, 22, Jun. 1998, pp. 3270–3272 describes a laser comprised of hexagonal ZnO microcrystallites obtained by MBE ("Molecular Beam Epitaxy"). These microcrystallites are auto-assembled in the form of a matrix on a sapphire substrate. In this case, also, pumping is performed optically using a frequency tripled YAG-Nd laser.

The optical pumping of these structures is complex and makes them difficult to use. It would, therefore, be advantageous to provide a simpler structure that is easier to use.

SUMMARY OF THE INVENTION

This invention relates to a semiconductor laser made of polycrystalline ZnO having the following features: a substrate, an underlayer constituted of a polycrystalline thin film for which crystal lattice parameters are adapted to those of ZnO and made of a multiplicity of grains having a crystallographic axis substantially perpendicular to the film plane, a thin film made of grains of ZnO having a crystallographic axis perpendicular to the film plane adjacent the underlayer, wherein each grain is surrounded by a boundary of an electrically insulating material, and an electrical pump which causes a current flow perpendicular to the film plane.

DETAILED DESCRIPTION

Figure 1:
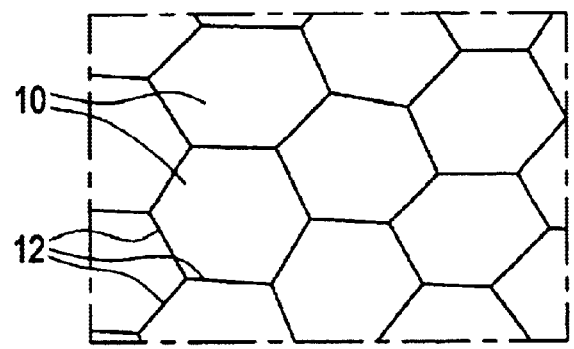
FIG. 1 shows a top view of a thin polycrystalline ZnO film with grains surrounded by electrically conducting boundaries according to the prior art.

It will be appreciated that the following description is intended to refer to specific embodiments of the invention selected for illustration in the drawings and is not intended to define or limit the invention, other than in the appended claims.

The invention also provides a laser which employs a polycrystalline ZnO film, but which allows electrical pumping (rather than optical), which is a great simplification.

More precisely, the invention provides a polycrystalline ZnO semiconductor laser, characterized by the following components:

on a substrate, an underlayer including a thin polycrystalline film, the crystal structure of which is adapted to that of ZnO, this underlayer being constituted of a mosaicity of grains having one crystallographic axix substantially perpendicular to the film plane;

on the underlayer a thin film made up of grains of ZnO having one crystallographic axis substantially perpendicular to the film plane, each grain being surrounded by a boundary of electrically insulating material; and a method for electrical pumping in which current is made to flow substantially perpendicularly to the film plane.

The invention also encompasses a method of fabricating a polycrystalline ZnO semiconductor laser consistent with the preceeding definition. This procedure is characterized by the following components:

deposition on a substrate of a polycrystalline thin film underlayer, the lattic parameters of which are adapted to those of ZnO, this underlayer being made up of a mosaicity of grains having one crystallographic axis substantially perpendicular to the film plane, to grow, on the underlayer, a thin film of ZnO together with an electrically insulating material that is compositional segregated from the ZnO, the growth of the film then produces grains of ZnO surrounded by boundaries of the aforementioned insulating material.

Preferably, the underlayer is, for example, ZnO (wurtzite), GaN (wurtzite), AlN (wurtzite), MgO (rocksalt) or the like.

Preferably, again, the electrically insulating material is MgO, CaO, SrO, BiO, BaO, TiO$_2$ or the like, for example.

The methods allowing the obtention of a resonant cavity can be, as used for conventional semiconductor lasers, mirrors on both sides of the ZnO film, or a diffraction grating at the film surface, or any other equivalent method.

Figure 2:
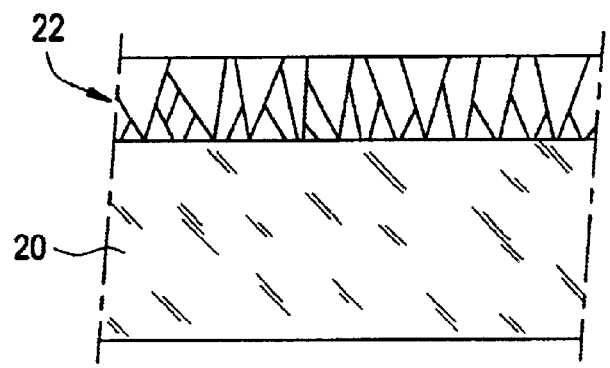
FIG. 2 shows a cross-sectional view of a substrate and a thin film according to the prior art.

In FIGS. 1 and 2, the structure of a conventional polycrystalline ZnO film, obtained by standard methods of vacuum deposition is shown. In FIG. 1, the markedly hexagonal grains 10 are separated by electrically conducting boundaries 12. FIG. 2 illustrates the disordered manner in which the grains of the film 22 grow out from the substrate 20.

Figure 3:
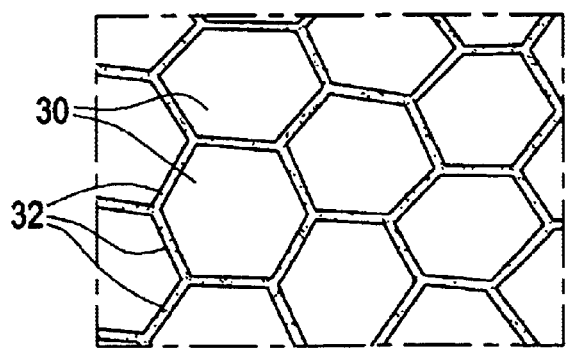
FIG. 3 shows a top view of grains surrounded by electrically insulating boundaries according to aspects of the invention.
Figure 4:
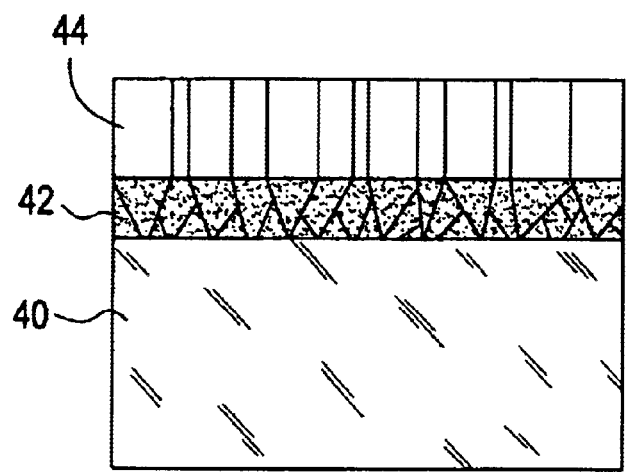
FIG. 4 shows a cross-sectional view of the layered structure with an underlayer and a film of ZnO according to aspects of the invention.

According to the invention, this is achieved as follows:

deposit on a substrate 40 a polycrystalline underlayer 42 having a lattice parameter adapted to the ZnO lattice; this underlayer has a mosaic structure: the crystallographic c-axis of the grains is very strongly oriented perpendicular to the film plane and these grains are disordered in the film plane (described as the "a-b plane");

on this underlayer, a layer 44 is grown comprising ZnO and an element which is not incorporated in the wurtzite structure of ZnO such that a compositional segregation occurs. The grains of the film 44 grow in a regular manner with one of the crystallographic axes ĉ substantially perpendicular to the film plane, the two other axes (a-b) being randomly oriented in the film plane. The markedly hexagonal grains 30 as shown in FIG. 3 are surrounded by an electrically insulating boundary 32.

The thickness of the polycrystalline underlayer 42 can range between about 1 nm and about 1 mm.

The substrate can be in amorphous glass, amorphous quartz, amorphous silicon or the like, for example.

The film depositions can be made using RF magnetron sputtering or laser ablation.

Figure 5:
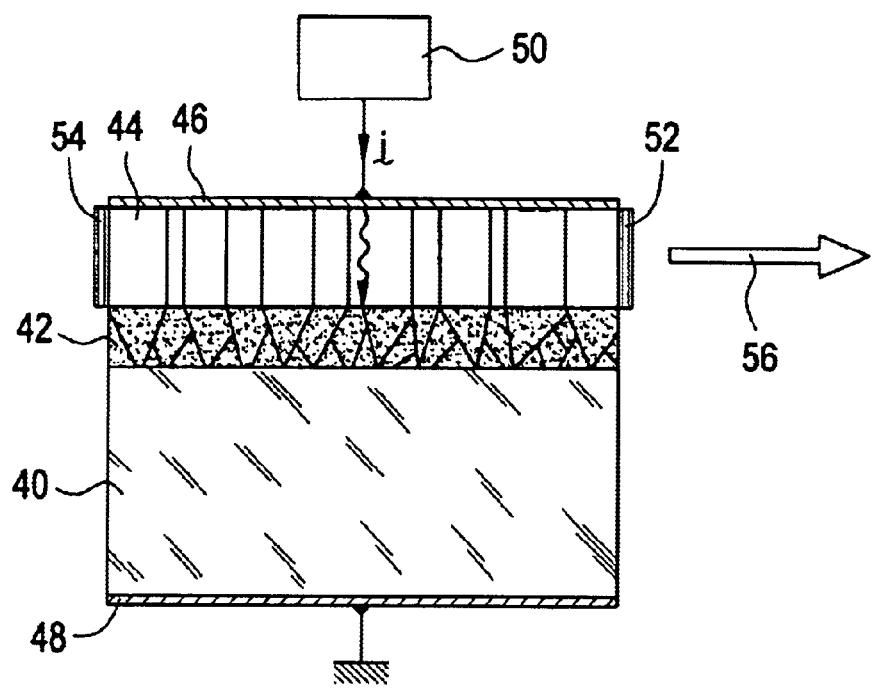
FIG. 5 shows a schematic of a laser according to aspects of the invention.

As can be seen in FIG. 5, the structure obtained can be completed by two electrodes 46-48, one of which is connected to a current generator 50, while the other is connected to ground. Two mirrors 52 and 54 located at either side of the active film 44 form a resonator. The stimulated emission is indicated by arrow 56. It occurs in the ultraviolet between about 2450 Å and about 3500 Å.

The regular nature of the grains and their electrical insulation from each other has the effect of channeling the current flow and avoiding electrical/current diffusion. This is what makes the electrical pumping effective.

What is claimed is:

1. A semiconductor laser made of polycrystalline ZnO comprising:

a substrate;

an underlayer constituted of a polycrystalline thin film which is crystallographically lattice matched to ZnO and made of a multiplicity of grains having a crystallographic axis substantially perpendicular to the film plane;

a thin film, on top of the underlayer, made of grains of ZnO having a crystallographic axis substantially perpendicular to the film plane, wherein each grain is surrounded by a boundary of an electrically insulating material; and an electrical pump which causes a current flow substantially perpendicular to the film plane.

2. The semiconductor laser of claim 1, wherein the underlayer is formed from a compound selected from the group consisting of ZnO, GaN, AlN and MgO.

3. The semiconductor laser as described in claim 1, in which the electrically insulating material is formed from a compound selected from the group consisting of MgO, CaO, BiO, BaO and $TiO_2$.

4. The semiconductor laser of claim 1, wherein the underlayer has a thickness of about 1 nm to about 1 mm.

5. The semiconductor laser of claim 1, wherein the substrate is formed from a material selected from the group consisting of amorphous glass, amorphous quartz and amorphous silicon.

6. The semiconductor laser of claim 1, wherein grain boundaries at a base of the ZnO thin film substantially match grain boundaries at the surface of the underlayer.

7. A procedure for fabricating a polycrystalline ZnO based semiconductor laser, comprising:

depositing an underlayer made up of a material which is crystallographically lattice matched to ZnO and made of a multiplicity of grains having a crystallographic axis substantially perpendicular to the film plane, on a substrate; and growing, on top of the underlayer, a thin film of ZnO together with another element that is segregated to the grain boundaries to produce grains of ZnO surrounded by boundaries of electrically insulating material.

8. The method of claim 7, wherein the underlayer is formed from a compound selected from the group consisting of ZnO, GaN, AlN and MgO.

9. The method of claim 7, wherein the electrically insulating material is formed from a compound selected from the group consisting of MgO, CaO, BiO, BaO and $TiO_2$.

10. The semiconductor laser of claim 7, wherein the underlayer has a thickness of about 1 nm to about 1 mm.

11. The semiconductor laser of claim 7, wherein the substrate is formed from a material selected from the group consisting of amorphous glass, amorphous quartz and amorphous silicon.

12. A semiconductor laser made of polycrystalline ZnO comprising:

a substrate;

an underlayer, grown on the substrate, constituted of a polycrystalline thin film which is crystallographically lattice matched to ZnO and which is made of a multiplicity of grains having a crystallographic axis substantially perpendicular to the film plane;

a thin film on top of the underlayer which is made of grains of ZnO having a crystallographic axis substantially perpendicular to the film plane adjacent, wherein each grain is surrounded by a boundary of an electrically insulating material; and an electrical pump which causes a current flow substantially perpendicular to the film plane.

13. The semiconductor laser of claim 12, wherein grain boundaries at a base of the ZnO thin film substantially match grain boundaries at the surface of the underlayer.

* * * * *